United States Patent [19]

Filliman

[11] 4,045,748
[45] Aug. 30, 1977

[54] AUDIO CONTROL SYSTEM
[75] Inventor: Paul Filliman, Fort Wayne, Ind.
[73] Assignee: The Magnavox Company, Fort Wayne, Ind.
[21] Appl. No.: 642,429
[22] Filed: Dec. 19, 1975
[51] Int. Cl.$^2$ .......................................... H03F 3/68
[52] U.S. Cl. ................... 330/126; 179/1 D; 179/1 VL; 330/30 R
[58] Field of Search ............ 179/1 D, 1 VL; 330/126, 330/30 R; 333/14, 28 T

[56] References Cited
U.S. PATENT DOCUMENTS

| | | | |
|---|---|---|---|
| 2,395,159 | 2/1946 | Albin | 330/126 |
| 3,426,292 | 2/1969 | Seidel | 330/126 |
| 3,539,725 | 11/1970 | Hellwarth et al. | 179/1 |
| 3,846,719 | 11/1974 | Dolby | 333/14 |
| 3,875,334 | 4/1975 | Hilbert et al. | 179/1 D |
| 3,903,485 | 9/1975 | Dolby | 333/14 |

OTHER PUBLICATIONS

Sansen et al. — "Distortion in Bipolar Transistor Variable-Gain Amplifiers" *IEEE Journal;* pp. 275-282, Aug. 1973.

*Primary Examiner*—Lawrence J. Dahl
*Attorney, Agent, or Firm*—George R. Pettit; William J. Streeter

[57] ABSTRACT

An audio control system for altering the frequency content of an audio signal with a d.c. control voltage. An audio signal is divided into a plurality of signal channels representing different portions of the audio signal frequency spectrum. Each signal channel is terminated by an attenuator which is responsive to a d.c. control voltage. The attenuated signals are then combined. By changing a d.c. control voltage a change in tone, volume, balance or loudness of an audio signal in a stereoamplifier or the like may be achieved.

8 Claims, 2 Drawing Figures

AUDIO CONTROL SYSTEM

BACKGROUND OF THE INVENTION

This invention relates to an audio control circuit used in two channel stereo and four channel stereo systems. Specifically, a type of "bass" and "treble" controls responsive to a d.c. voltage are described.

Circuit means for changing the bass or treble in a high fidelity audio system are described in U.S. Pat. No. 3,863,293 and in other references. The earlier audio control systems required mechanical motion on operate variable potentiometers. The change in resistance is used in one potentiometer to effect a change in bass and in another potentiometer to change the treble.

Where it is desirable to change the bass or treble in a two channel stereo system, a set of controls must be supplied to each channel. It is therefore desirable to have an audio control system for changing the bass or treble that is responsive to a single mechanical motion. This can be achieved by mechanically coupling the bass and treble controls of a first channel to the bass and treble controls of a second channel.

In four channel quadrophonic systems mechanical coupling between controls is more difficult to implement and "tracking" between channels becomes difficult to maintain. Consequently it is desirable to have a bass and treble control that responds to a d.c. voltage. A common d.c. voltage can then be used to control the bass and treble of several distinct channels.

A system that operates by means of a d.c. control voltage must exhibit high noise immunity to prevent noise from being introduced into the signal channel. Where low level signals are being processed noise susceptibility is a particular disadvantage of d.c. control systems. Prior art systems also suffer from a limitation in the dynamic range of signal levels that may be controlled.

Audio control systems must also produce a minimum of signal distortion in order to preserve the signal fidelity. Consequently it is undesirable to include non-linear circuit elements or frequency sensitive circuit elements in an audio control system.

Bass and treble controls must also be independent of each other. In some prior art bass and treble control systems, a change in bass would produce a small change in the treble.

SUMMARY OF THE INVENTION

It is an object of the invention to provide a low distortion, large signal capability, and high noise immunity audio control system.

It is another object to provide a bass and treble control for a high fidelity audio system responsive to a d.c. control voltage.

A further object of the present invention is to provide bass and treble controls which are independent of each other.

A still further object of the present invention is to have volume control, tone control, loudness control, and balance control in a single commercially economic package suitable for large scale manufacture.

In accordance with the invention an audio control system is provided. The audio signal is separated into a plurality of signal channels representing different portions of the audio frequency spectrum. At least one signal channel is terminated with an analog variable attenuator. The attenuation level is set by a d.c. voltage applied to the attenuator.

The attenuator output signals are combined with an unattenuated signal channel to provide the controlled audio signal. By varying the d.c. voltage on each attenuator, the audio signal frequency spectrum of the combined signal may be altered. The invention may be used in this manner as a bass and treble control in an audio high fidelity system. In one embodiment of the invention, a bass and treble control was constructed by separating the audio signal into three frequency channels, the first having low frequency content, the second having high frequency content, and the third having the mid-range frequency content of an audio signal. The signal produced by each filter is converted into two biphase currents. The high and low frequency channels are terminated with attenuators for receiving the biphase currents. The attenuator outputs are combined with the mid-range frequency to obtain a reconstructed audio signal. By altering the attenuation in the low frequency channel, the bass is changed and by altering the attenuation in the high frequency channel the treble is changed. The recombined biphase signals are then applied to another attenuator which controls the volume of the recombined signal.

DESCRIPTION OF THE PREFERRED EMBODIMENT

Figure 1:
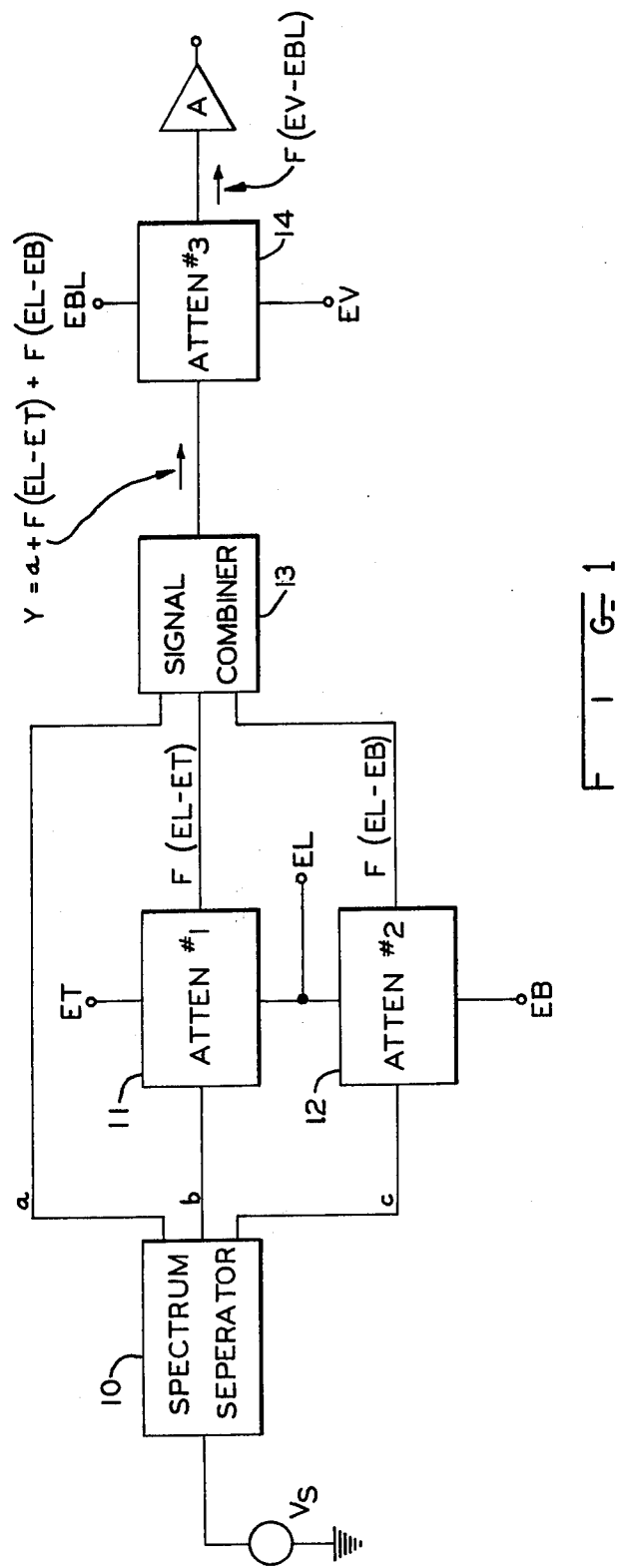
FIG. 1 is a block diagram illustrating an apparatus for controlling the frequency response of an audio signal in accordance with the invention.

Referring to FIG. 1, a block diagram illustrating the invention is shown. The signal $V_s$ to be controlled is applied to a spectrum separator 10 for separating the signal into a plurality of signal channels, each having a different frequency spectrum. Two of the resulting signal channels are attenuated by analog attenuators 11 and 12. The output of attenuator 12 is determined by the voltage (EL−EB). The output of attenuator 11 is determined by the voltage difference (EL−ET). The attenuated signals are combined with an unattenuated signal channel in a signal combiner 13. The composite signal is then applied to a third attenuator 14. This attenuator regulates the amplitude of the composite output signal. The magnitude of d.c. voltage (EV−EbL) determines the magnitude of the composite signal. EV may represent an overall volume control level and EbL may represent a channel balance control level.

The invention operates so as to change the energy distribution of an audio signal frequency spectrum. Where one attenuated signal channel contains the lower portion of the audio signal frequency spectrum a bass control is realized. Where one attenuated signal channel contains the higher portion of the audio signal frequency spectrum, a treble control is realized.

Figure 2:
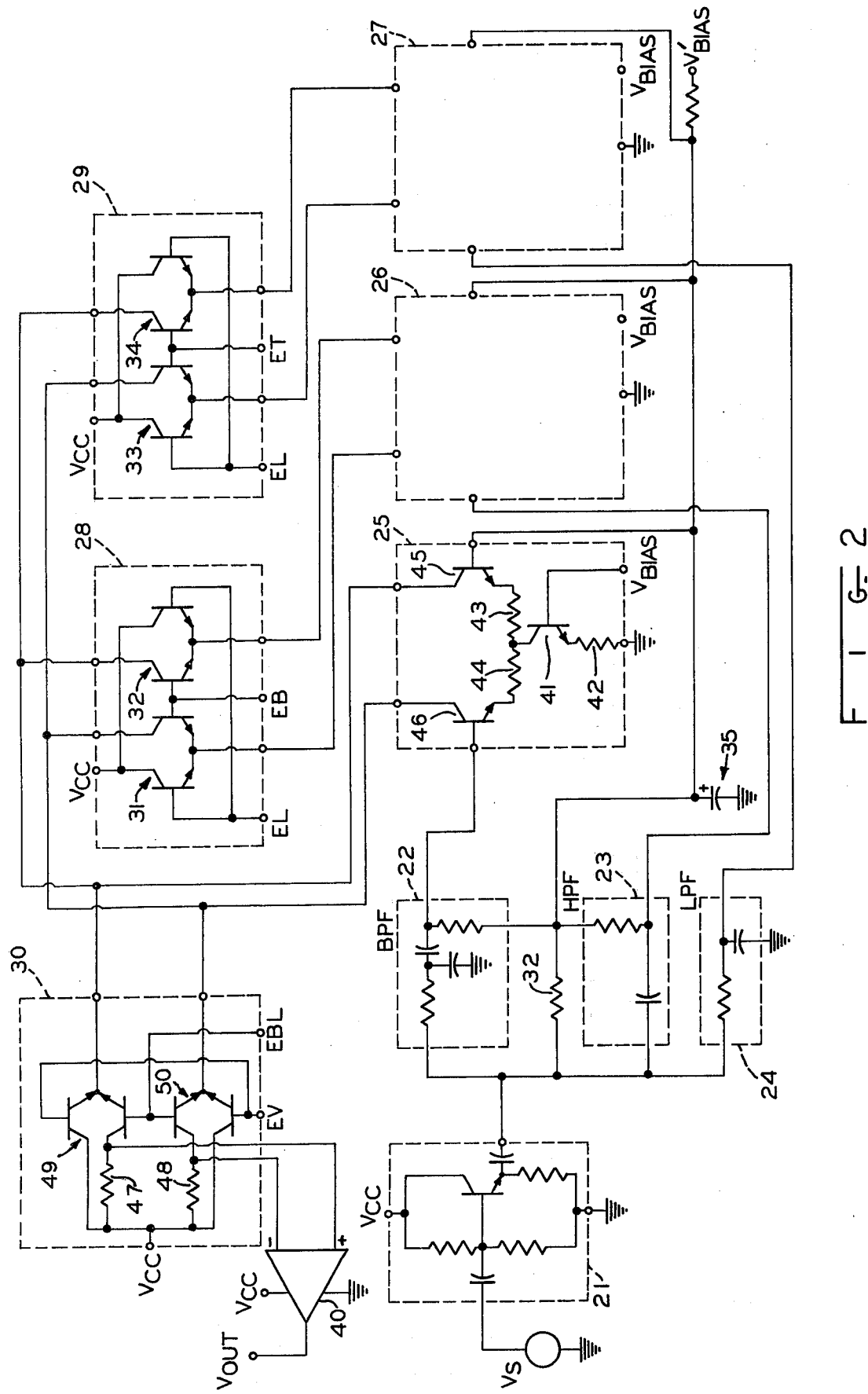
FIG. 2 is a schematic drawing illustrating the preferred embodiment of the invention.

Referring to FIG. 2, an audio control system having low distortion, large signal handling capability, and high noise immunity is shown. An emitter follower amplifier 21 having its input and output a.c. coupled provides a signal to three filter circuits which perform a spectrum separation function. The input audio signal is divided into low, high, and mid-frequency range signals. These signals are applied to differential amplifiers 25, 26, 27. The differential amplifiers convert the signals into biphase currents. Further processing of the signal in the form of biphase currents reduces signal noise susceptibility and preserves the signal fidelity.

The differential amplifier 25 operates in the following manner. A current source consisting of transistor 41 and resistor 42 is connected to a common source of bias voltage. The resulting current enters transistors 45 and 46 through emitter resistors 43, 44. The signal from bandpass filter 22 is applied to the base of transistor 46. Transistor 45 has the base connection returned through the resistor 32 to the audio signal input. An a.c. signal bypass capacitor 35 is connected from the base of transistor 45 to ground. The collectors of transistors 45, 46 provide biphase signal currents for combination with other signal currents thus avoiding development of voltages which can cause distortion.

Differential amplifiers 26, 27 operate in a manner identical to differential amplifier 25. Signals provided by the low pass filter 24 and high pass filter 23 are converted into biphase signal currents. The biphase signal currents enter quadrature attenuators 28, 29. Each attenuator consists of two transistor pairs 31, 32, 33, 34 for controlling each of the biphase currents. The transistors comprising each transistor pair have their emitters connected together. One transistor collector of each pair is connected to a d.c. voltage source, Vcc. The voltage differences (EL−Eb) and (EL−ET) between the transistor bases of each transistor pair determines the amount of attenuation each biphase signal receives. The amount of signal attenuation determines the amount of bass or treble imparted to the signal.

The attenuator 28, 29 output currents are combined with the output currents of differential amplifier 25.

The overall amplitude of the recombined signal is controlled by attenuator 30. The attenuator operates in a manner similar to attenuators 28, 29. Two resistors, 47, 48 convert the biphase currents produced by the transistor pairs 49, 50 into a differential voltage. This voltage is supplied to an amplifier 40 to produce an output signal. EV is a d.c. voltage which may represent a volume control and EbL is a d.c. voltage which may represent the balance between signal channels in a multichannel audio control system. Those skilled in the art will recognize that EV can be used to control Eb and ET to effect a loudness control function. It will be further recognized that this embodiment allows for maximum signal handling capability with low power supply voltages thereby lending itself to large scale manufacture in a low cost integrated circuit.

Thus there is described a voltage controlled audio control system suitable for use in monaural, two channel, or four channel audio systems. Other embodiments of the invention herein claimed will be obvious to those skilled in the art.

What is claimed is:

1. An audio control apparatus for controlling a signal comprising:
    a. a plurality of frequency selective filters, said filters having a common input for receiving an audio signal;
    b. a plurality of differential amplifiers for receiving said filter output signals each of said differential amplifiers providing biphase signal currents in response to an input voltage;
    c. a plurality of attenuators for controlling said biphase signal currents produced by each of said differential amplifiers, said attenuators having a selectable attenuation level; and
    d. means for combining said attenuator output signals to form a composite signal, said composite signal having a frequency spectrum dependent upon the relative attenuation levels provided by said attenuators.

2. An apparatus for controlling an audio signal comprising:
    a. means for dividing said signal into a plurality of biphase signals having different frequency spectri;
    b. a plurality of quadrature attenuators for selectively varying the amplitude of each of said biphase signals representing different frequency spectri; and
    c. means for combining said quadrature attenuator output signals whereby a composite signal is formed having a frequency spectrum dependent upon the relative attenuation levels provided by said attenuators.

3. An apparatus for controlling the frequency content of an audio signal comprising:
    a. means for dividing an audio signal into first and second signals having different frequency spectri;
    b. a first attenuator means for receiving said first signal of said means for dividing, said attenuator means having a selectable attenuation level;
    c. a second attenuator means for receiving said second signal of said means for dividing, said attenuator means having a selectableattenuation level; and
    d. a means for combining said audio signal with said first and second attenuator means output signals to produce a third signal having a frequency spectrum which is controllable by selectively varying the attenuation level of said attenuators.

4. An apparatus for controlling the frequency content of an audio signal comprising:
    a. a first filter means for removing the low frequency content of said audio signal;
    b. a second filter means for removing the high frequency content of said audio signal;
    c. a first attenuator for selectively controlling the amplitude of said first filter means output signal;
    d. a second attenuator for selectively controlling the amplitude of said second filter means output signal;
    e. a bandpass filter for simultaneously removing the high and low frequency components of said audio signal; and
    f. signal combining means for combining the outputs of said first attenuator, said second attenuator, and said bandpass filter whereby a composite signal is formed having a selectable frequency spectrum dependent upon the amplitude of said first and second attenuator output signals.

5. An audio signal control apparatus of claim 4 further comprising a third attenuator for receiving said signal combiner output signal.

6. An audio signal control apparatus of claim 5 further comprising an amplifier for receiving the output signal of said third attenuator.

7. An apparatus for controlling an audio signal comprising:
    a. means for dividing an audio signal into first biphase signal currents, second biphase signal currents, and third biphase signal currents, each of said biphase signal currents representing a different portion of said audio signal frequency spectrum;
    b. a first attenuator for receiving said first biphase signal currents, said attenuator having a selectable attenuation level for controlling the amplitude of said biphase signal currents;

c. a second attenuator for receiving said second biphase signal currents, said attenuator having a selectable attenuation level for controlling the amplitude of said biphase currents;

d. means for combining said third biphase signal currents with said first and second attenuator output signals to produce fourth biphase signal currents; and e. means for converting said fourth biphase signal currents into a single phase signal voltage, said signal voltage having a frequency spectrum dependent upon the relative attenuation provided by said attenuators.

8. The apparatus of claim 7 further comprising an attenuator for controlling the magnitude of said fourth biphase signal currents.

* * * * *